(12) United States Patent
Rapuano et al.

(10) Patent No.: US 6,955,740 B2
(45) Date of Patent: Oct. 18, 2005

(54) PRODUCTION OF LAMINATES FOR PRINTED WIRING BOARDS USING PROTECTIVE CARRIER

(75) Inventors: Joseph C. Rapuano, Atkinson, NH (US); Peter L. Samevall, Perstorp (SE); Ronny Varul, Tyringe (SE)

(73) Assignee: Polyclad Laminates, Inc., Franklin, NH (US)

( * ) Notice: Subject to any disclaimer, the term of this patent is extended or adjusted under 35 U.S.C. 154(b) by 298 days.

(21) Appl. No.: 10/044,628

(22) Filed: Jan. 10, 2002

(65) Prior Publication Data

US 2003/0127187 A1 Jul. 10, 2003

(51) Int. Cl.[7] ............................................. B32B 31/26
(52) U.S. Cl. .................... 156/307.7; 156/288; 156/289; 270/52.09
(58) Field of Search ................................ 156/233, 288, 156/289, 307.7, 306.9; 29/830, DIG. 1; 428/209

(56) References Cited

U.S. PATENT DOCUMENTS

| | | |
|---|---|---|
| 3,989,235 A | 11/1976 | Husges |
| 4,293,617 A * | 10/1981 | Nagy .......................... 428/469 |
| 4,356,054 A | 10/1982 | Gotz |
| 4,875,283 A | 10/1989 | Johnston |
| 5,160,567 A | 11/1992 | Konicek et al. |
| 5,354,409 A | 10/1994 | Gotz |
| 5,482,586 A | 1/1996 | Fujikake et al. |
| 5,674,596 A | 3/1998 | Johnston |
| 5,725,937 A | 3/1998 | Johnston |
| 5,853,528 A * | 12/1998 | Maeda et al. ................ 156/474 |
| 5,891,291 A | 4/1999 | Okamoto et al. |
| 5,942,314 A | 8/1999 | Fisher et al. |
| 5,942,315 A | 8/1999 | Johnston |
| 5,951,803 A | 9/1999 | Johnston |
| 6,048,430 A | 4/2000 | Johnston |
| 6,130,000 A | 10/2000 | Frater |
| 6,158,492 A | 12/2000 | Vomberg |
| 6,179,947 B1 | 1/2001 | Maeda et al. |

FOREIGN PATENT DOCUMENTS

| | | |
|---|---|---|
| WO | WO 99/53737 | 10/1999 |
| WO | WO 00/16596 | * 3/2000 |

* cited by examiner

*Primary Examiner*—Jeff H. Aftergut
*Assistant Examiner*—John L. Goff
(74) *Attorney, Agent, or Firm*—Mintz, Levin, Cohn, Ferris, Glovsky and Popeo, P.C.

(57) ABSTRACT

A laminate to be used in the manufacture of printed circuit boards is formed by contacting one surface of a layer of a conductive foil (e.g. copper foil) with protective-carrier sheeting (e.g., aluminum foil) and the other surface of the conductive foil with a dielectric layer (e.g., prepreg). The contacted layers are stacked and cut to desired dimensions. The process is performed without use of adhesive or mechanical attachment. Consequently, contamination and the occurrence of imperfections in the conductive foil of a laminate to be used in a printed wiring board can be substantially reduced.

10 Claims, 6 Drawing Sheets

PRODUCTION OF LAMINATES FOR PRINTED WIRING BOARDS USING PROTECTIVE CARRIER

FIELD OF THE INVENTION

The present invention provides a method for producing a copper-clad laminate subsequently used in fabrication of printed circuit boards and electronic assemblies. The invention also provides a method to achieve a high level of surface quality over traditional methods of layup assembly.

BACKGROUND

In its simplest form, a copper-clad laminate includes, as a component, one or more dielectric layers of woven or nonwoven glass fiber impregnated with epoxy or other polymer resin, the composite is known in the art as "prepreg." The prepreg is sandwiched between sheets of metal foil, typically copper, and supported by a steel or aluminum plate of varying thickness. These plates act as a tooling plate for subsequent high-pressure lamination, which bonds the copper foil and epoxy prepreg, resulting in a laminate sheet.

These laminates are generally manufactured in bulk and are generally stacked one upon another. The assembly of one laminate is referred to as a press layup and the stack of laminates is known as a book. Presently, the book is manufactured by a process involving heating a plurality of layers that make up each laminate and then subjecting the book to pressure. After curing and cooling, the then-bonded individual laminates are separated from one another and subjected to further processing.

It is typically highly desirable in the manufacture of these laminates to prevent and eliminate, to the greatest practicable extent, contamination of the foil sheets and to maintain cleanliness during the manufacturing process. It is known that the main causes of contamination are the presence of resin dust, fiberglass fibers, particulate matter and various other types of foreign material. During the manufacturing process, great care is taken to prevent resin dust and other contaminants from settling on the copper surfaces.

The presence of pits or dents or unwanted deposits of molten resolidified resin on the surface of the copper sheets is a major cause for concern in the manufacturing process. These pits and dents can result from the presence of resin dust on the foil during the heating and laminating process, which in turn causes an indentation or depression in the copper. Pits and/or dents in the copper foil may also result from the use and handling of extremely thin foils. The presence of a pit, dent or unwanted deposit of molten resolidified resin on the surface of the copper foil will generally result in a defect in the finished product due to a shorted or open conductive path in an etched circuit layer.

In one known method for manufacturing laminates for printed circuit boards, a laminate of a sheet of copper foil and a sheet of aluminum or the like are joined around their borders using a band of flexible adhesive, creating a protected central zone at the interface of the sheets. One drawback to this method, however, is that the use of adhesive in the manufacture of the laminate renders the surface susceptible to the aforementioned problems involving the presence of contaminants and stains, pits and/or unwanted deposits of dried adhesive. Additionally, the adhesive bond has been known to induce stress that can result in wrinkles along one or more borders in the finished laminate.

In another known method, a strip of copper foil is ultrasonically welded to a second strip of a supporting metal, preferably aluminum or stainless steel, at their respective edges. The ultrasonic welding process, while effective in bonding the sheets of copper and aluminum, is slow and requires multiple machines to match the current productivity rate compared to the typical steel plate manufacturing method.

In both of these methods, the actual construction of an electrical grade laminate becomes a secondary operation, making the process more costly due to the additional handling, packaging shipping and assembly steps required. Additionally, the user is constrained by limited supply sources and requires excess inventories on hand to meet ever-changing market and customer demands.

The conductive copper foils that are used in the production of laminates generally have an untreated surface on one side and a treated surface on the opposite side. The treatment that is performed on the "treated" side typically includes plating the copper surface with copper nodules to promote adhesion. In the previously described copper/protective carrier/copper component, the untreated surfaces of the copper sheets face and contact the protective carrier layer disposed between the copper foil sheets. In a printed circuit board laminate, the untreated surfaces of the copper sheets constitute a functional element and are generally etched to produce the desired circuit conductor configuration. It is for this reason that the untreated surfaces of the copper foil sheets should be kept substantially uncontaminated and free of imperfections. The treated surfaces of the copper foil sheets contact and adhere to the prepregs in the book layup.

SUMMARY

The present invention relates to printed circuit board laminates and a process for making laminates used in the manufacture of printed circuit boards. More specifically, the present invention is directed to a process for producing laminates used in the manufacture of printed circuit boards in which the conductive (e.g., copper) foil is protected from contamination.

In accordance with embodiments of this invention, a laminate for a printed wiring board is produced by covering a layer of conductive foil with a layer of protective-carrier sheeting. The protective-carrier sheeting can be sandwiched between two conductive-foil layers. The conductive-foil/protective-carrier-sheeting/conductive-foil composite can, in turn, be sandwiched between dielectric layers. In particular embodiments of the process, either a dielectric layer or a layer of protective-carrier sheeting can be sandwiched between two layers of conductive foil extended from copper-foil sources, such as rolls of copper foil. The laminate can be layed up in accordance with this process without use of adhesive or mechanical attachment to join the layers. The process can also be repeated to form a repeating structure having the sequence of protective-carrier sheeting, conductive foil, dielectric layer and conductive foil.

The conductive foil typically is formed of copper, though other materials from which conductive pathways can be formed can also be used. The protective-carrier sheeting typically is formed of aluminum, though other non-contaminating foils, typically formed of metal, can also be used; in particular embodiments, the protective-carrier sheeting has a thickness in the range from about 0.1 mm to about 0.25 mm. Finally, the dielectric layer can be a prepreg layer.

If a dielectric layer is sandwiched between the conductive-foil layers, at least one of the conductive-foil layers is covered with protective-carrier sheeting. If a layer of protective-carrier sheeting is sandwiched between the conductive-foil layers, the conductive-foil layers can be covered with dielectric layers. In either case, essentially the same repeating laminate structure can be formed. The conductive-foil layers can be severed from the rolls of conductive foil after the layers are stacked. In additional embodiments, the conductive foil and the protective-carrier sheeting can be wound together on a double roll. In each of these embodiments, the process for forming the book of the repeating laminate structure can be carried out with a single piece of machinery in an essentially continuous process.

The process can be repeated to produce a book of repeating copper-dielectric-copper structures separated by protective-carrier sheeting. The book can then be pressed in a lamination press to form a bonded laminate, wherein the conductive-foil layers are bonded to the dielectric layers. One or more of the copper layers can then be selectively etched to leave a network of conductive copper pathways on the laminate and processed into an innerlayer or a completed printed wiring board.

Advantages that can be achieved with the laminates and methods for making laminates, described herein, over existing techniques include the following: (1) providing simpler (and hence, faster) laminate fabrication; (2) reducing contamination and imperfections in the conductive foil; (3) allowing use of multiple conductive foil and/or protective-carrier sheeting suppliers at the laminator's discretion; (4) reducing cost and complexity and improving yields as a consequence of not needing to use adhesives or mechanical attachment in the process; (5) reducing carried inventories, as this process is "on-line"; (6) eliminating the need to handle stacks of copper-aluminum-copper composite laminates in process; (7) offering flexibility to employ other metal foils or polymeric films in the fabrication process as technology changes; and (8) enabling monitoring of cleanliness as an in-house operation, rather than at an offsite converter.

The above description sets forth broader features found in embodiments of the present invention in order that the detailed description thereof that follows may be understood, and in order that the present contributions to the art may be better appreciated. Other aspects of the present invention will become apparent from the following detailed description of specific embodiments considered in conjunction with the accompanying drawings. It is to be understood, however, that the drawings are not necessarily to scale and are designed solely for the purposes of illustration and not as a definition of the limits of the invention.

BRIEF DESCRIPTION OF THE DRAWINGS

The invention will be better understood by reference to the appended figures in which.

DETAILED DESCRIPTION

A laminate for use in manufacturing a printed wiring board (also known as a printed circuit board) is made from a dielectric layer (e.g., prepreg), conductive foil (e.g., copper foil) and protective-carrier sheeting (e.g., aluminum foil). The conductive-foil layers can be supplied from one or more rolls of conductive foil, and the protective-carrier sheeting can likewise be supplied from a roll. When the conductive foil is unwound from the roll, the conductive foil is contacted with a layer of protective-carrier sheeting, wherein the conductive foil is promptly covered with the protective-carrier sheeting before the conductive foil faces substantial exposure to sources of contamination. In some embodiments, the conductive foil may even be cosheeted with the protective-carrier sheeting before the conductive foil is wound onto the roll (i.e., the conductive foil and protective-carrier sheeting are wound together onto the roll in alternating layers).

Alternatively, the cosheeted conductive foil and protective-carrier sheeting can be combined from separate rolls on a Rosenthal Copper Sheeter (guillotine cut), available from Rosenthal Mfg., Inc., Northbrook, Ill., U.S.A., or other similar equipment designed to cut sheets of product from rolled goods. The process can be carried out in an automated fashion inside a controlled clean-room environment. One suitable piece of equipment is an automated lay-up machine, available from Parker Hannifin GmbH (Offenburg, Germany), also known as EMD Hauser, which is designed to combine copper rolls with prepreg sheets, cut the sheets and combine the sheets with steel plates to complete the laminate buildup process. The automated lay-up machine can be modified by substituting an aluminum roll unwind in place of the prepreg inserter; the modified machine can then be operated to combine aluminum and copper in a cosheet.

Working with unrolled aluminum as the protective-carrier sheeting can be quite challenging due to the difficulty of keeping aluminum foil flat as it is unrolled. However, this problem can be solved by incorporating one or more S-wraps in series to flatten the aluminum foil.

Figure 1:
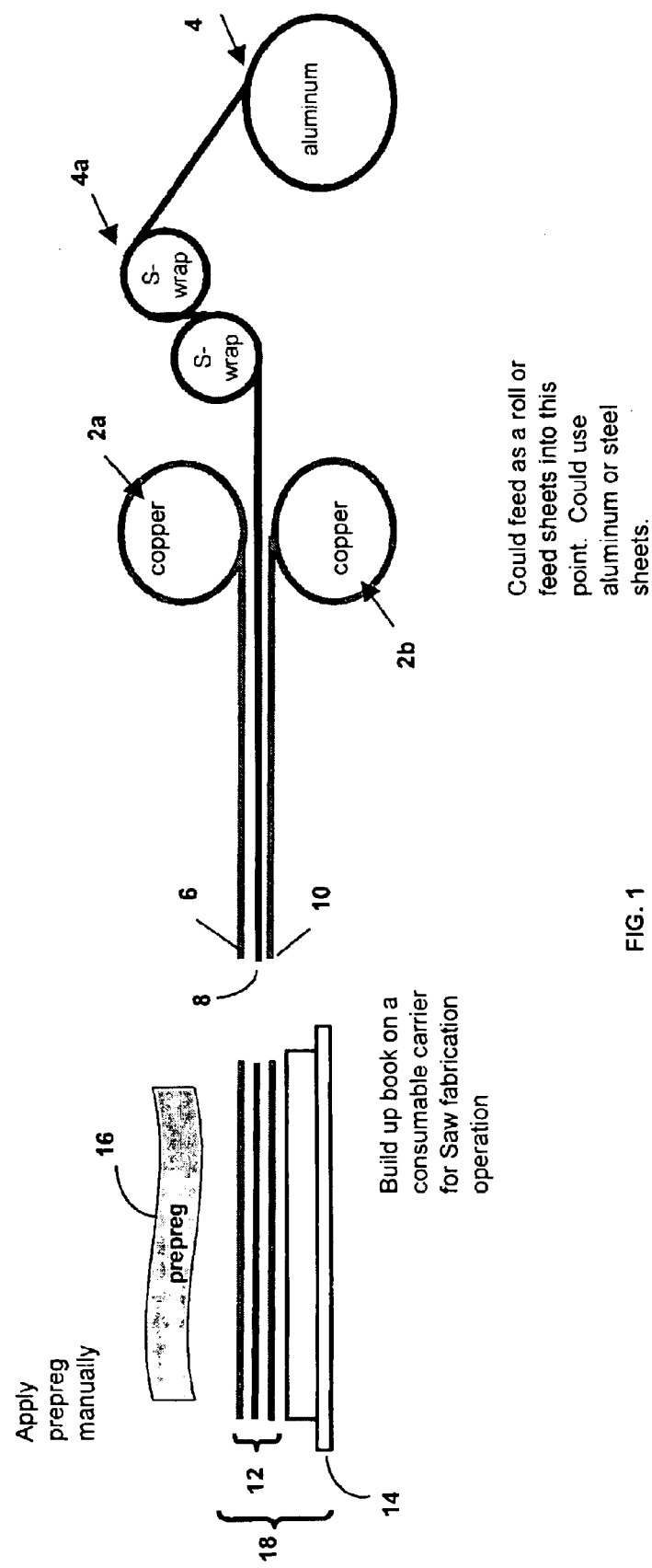
FIG. 1 is a diagram illustrating an apparatus and process for forming a copper-clad laminate, wherein aluminum sheeting is fed between a pair of copper-foil rolls.

FIG. 1 diagrammatically illustrates an apparatus and process, wherein a roll of aluminum sheeting 4, which is advantageously an aluminum foil, is positioned to feed the aluminum sheeting through an S-wrap 4a and then between an upper copper foil roll 2a and a lower copper foil roll 2b. Upper and lower copper foil rolls 2a, 2b advantageously comprise rolled copper foil. As the process proceeds, the upper and lower copper foil rolls 2a, 2b and the aluminum sheeting roll 4 unwind simultaneously such that an aluminum sheet 8 extends from the aluminum roll 4 and is sheeted or "sandwiched" between an upper copper sheet 6 that unwinds from upper copper foil roll 2a and a lower copper sheet 10 that unwinds from lower copper foil roll 2b. The three sheets, with the aluminum sheet 8 positioned between upper copper sheet 6 and lower copper sheet 10, are dispensed from their respective rolls with the aid of motor-driven unwinds and are drawn by a set of grippers 12 that provide tension control and positioning. The copper-aluminum-copper sheets 6, 8, 10 are drawn by grippers 12 onto a carrier 14. The sheet assembly 6, 8, 10 is subsequently cut to the desired length using a shear or high-power knife that is capable of cutting through sheets of varying thickness.

The copper sheets 6, 10 can be in the form of foil, such as, but not limited to, electrodeposited types described as DSTF™ (drum side treated foil), DT (double treat), standard (shiny), as well as others known to those skilled in the art. Alternatively, rolled annealed copper foil may be used. Although it is preferred to use aluminum sheet 8 between upper copper sheet 6 and lower copper sheet 10, it is to be understood that the invention is not limited in this respect and other protective carrier components, such as sheets of steel or rigid plastic capable of withstanding 300–400° F. (~150–200° C.) lamination temperatures, may also be used without detracting from the present invention.

Copper sheets, such as upper copper layer 6 and lower copper layer 10, generally have an untreated surface on one side and a treated surface on the reverse side. When upper copper layer 6 and lower copper layer 10 are arranged with aluminum sheeting 8 in a sandwich configuration, upper and lower copper layers 6, 10 are advantageously positioned such that the untreated surfaces of both layers contact aluminum sheeting 8 so as to eliminate or greatly reduce contamination to the untreated copper surfaces. Reduced contamination of the untreated copper surfaces is important because the surfaces constitute a functional element of the constructed printed circuit board and are generally etched to produce a desired circuit conductor configuration. On the other hand, the treated surfaces of the copper layers 6, 10 face away from the aluminum sheeting 8 so that the copper layers can be bonded to a dielectric, such as prepreg.

One or more dielectric layers, typically in the form of epoxy-coated fiberglass layers or prepreg 16, are then applied on top of the copper-aluminum-copper layers 6, 8, 10 to form a composite layup 18 that is unbonded by adhesive or mechanical attachment. Next, the process is repeated such that another "sandwich" of copper-aluminum-copper layers 6, 8, 10 is drawn across the stack of copper-aluminum-copper sheets 6, 8, 10, cut to desired length, and prepreg 16 positioned thereon. This sequence is repeated as many times as desired until enough sheets have been assembled for insertion into one opening of a lamination press.

Figure 2:
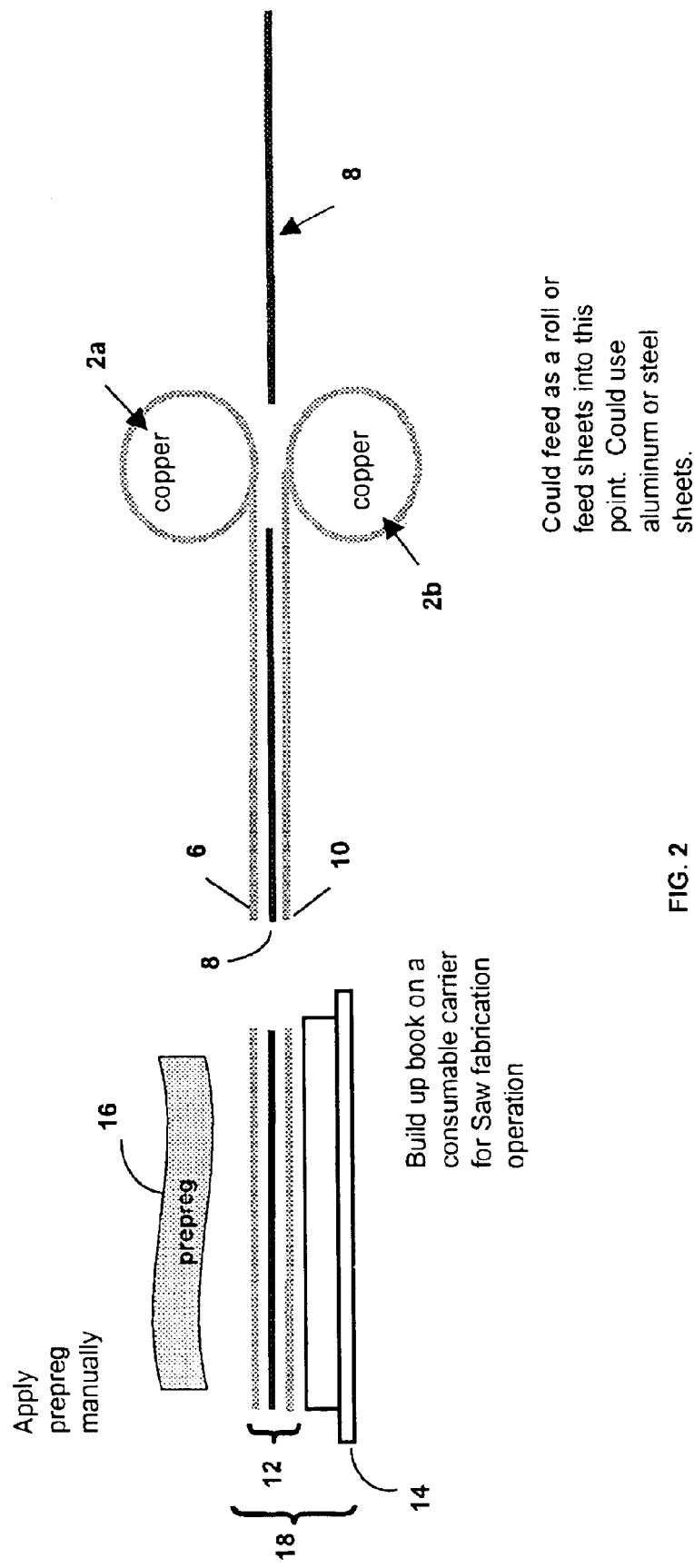
FIG. 2 is a diagram illustrating another apparatus and process for forming a copper-clad laminate, wherein sheets of aluminum foil are fed between a pair of copper-foil rolls.

In a second embodiment, illustrated in FIG. 2, sheets of copper and aluminum are arranged such that an aluminum sheet 8 is sandwiched between upper copper layer 6 and lower copper layer 10, and then drawn by gripper 12 onto carrier 14. One or more layers of epoxy-coated fiberglass layers or prepreg 16 are then applied on top of the copper-aluminum-copper sheets 6, 8, 10 to form a composite layup 18 that is unbonded by adhesive or mechanical attachment.

Figure 3:
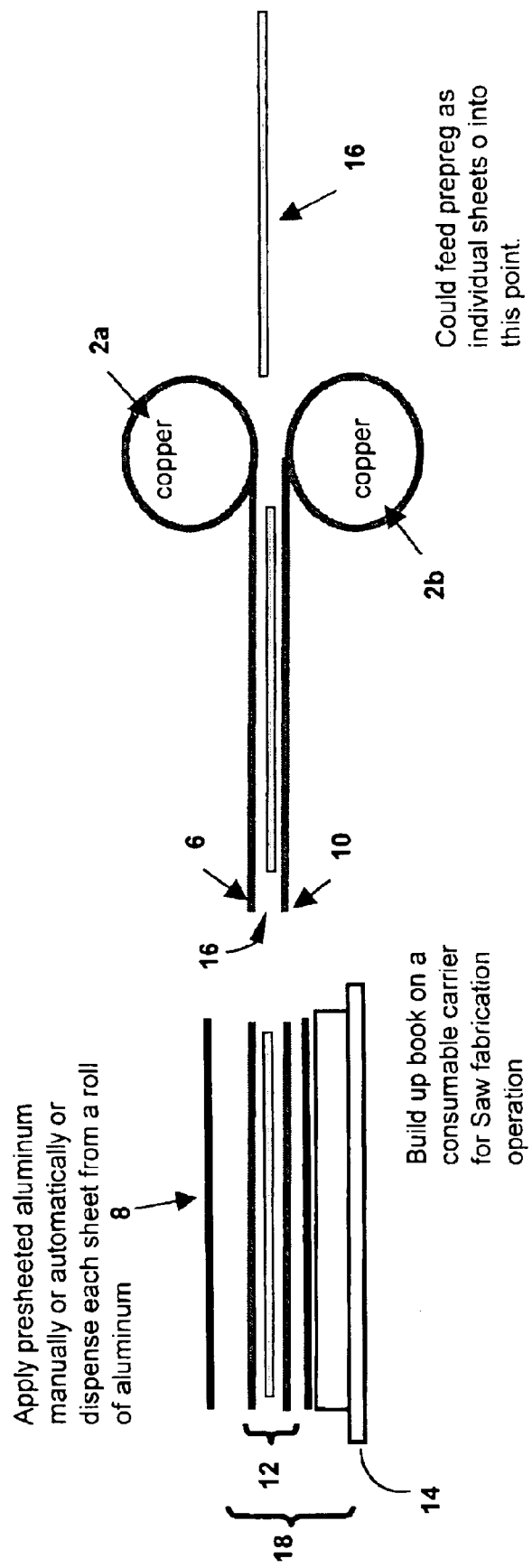
FIG. 3 is a diagram illustrating yet another apparatus and process for forming a copper-clad laminate, wherein sheets of prepreg are fed between a pair of copper-foil rolls.

In a third embodiment, illustrated in FIG. 3, sheets of aluminum 8 may again be pre-cut. The prepreg 16 is sandwiched between an upper copper sheet 6 and a lower copper sheet 10 to effectively segregate the prepreg between the copper layers and reduce the potential for dust from the prepreg to escape and contaminate the process. The sandwiched prepreg is then drawn by a gripper 12 onto carrier 14, and the aluminum sheet 8 is placed on top of the unbonded copper-prepeg-copper stack. This sequence is repeated as many times as desired until enough sheets have been assembled for insertion into one opening of a lamination press.

Figure 4:
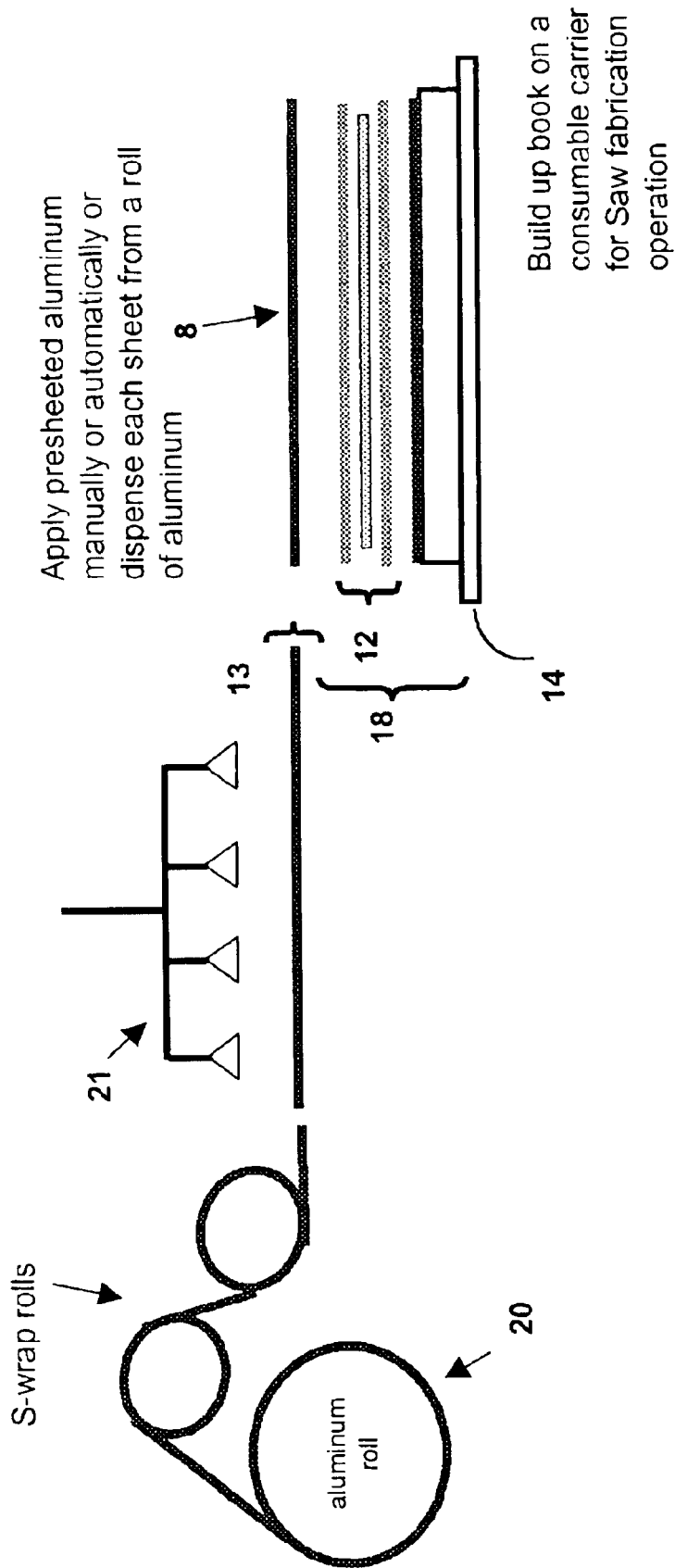
FIG. 4 is a diagram illustrating an apparatus for supplying sheets of aluminum foil to the book in the apparatus of FIG. 3.

As illustrated in FIG. 4, the aluminum sheet 8 can be dispensed from a roll of aluminum sheeting. The prepreg 16 is sandwiched between an upper copper sheet 6 and a lower copper sheet 10, and then drawn by a gripper 12 onto carrier 14, and the aluminum sheet 8 is placed on top of the unbonded copper-prepeg-copper stack. The dispensed sheet 8 is cut and placed on the top copper sheet using a set of grippers 13 or an overhead picking device 21. Alternatively, the aluminum sheets can be fed from a pre-cut stack.

In a fourth embodiment, upper copper layer, aluminum sheeting and lower copper layer, in the sandwich arrangement, may be pre-wound onto a single roll, which is then unwound and drawn to the carrier by the gripper and cut to the desired size.

Figure 5:
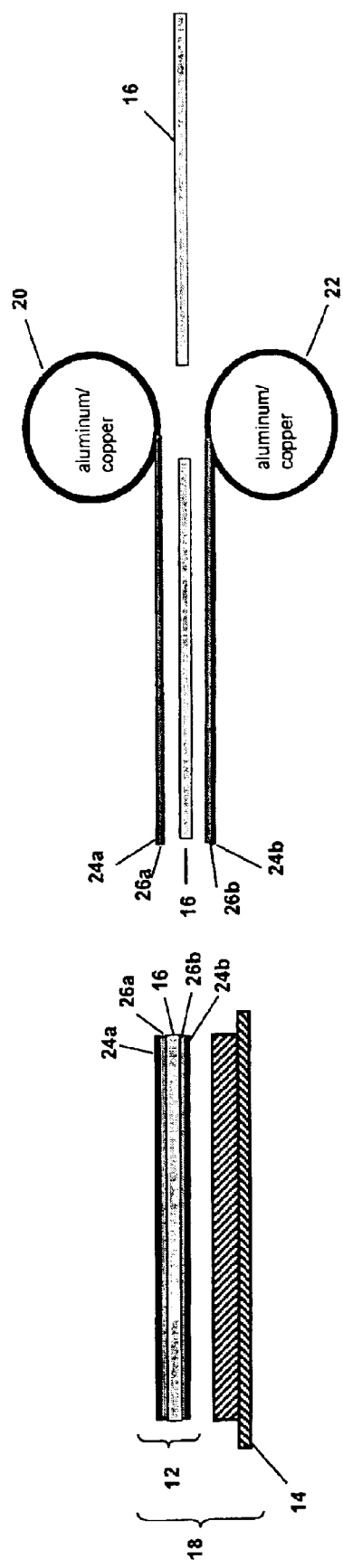
FIG. 5 is a diagram illustrating still another apparatus and process for forming a copper-clad laminate, wherein aluminum sheeting and copper foil are cosheeted on a pair of rolls and sheets of prepreg are fed between the rolls.

In a modification of the fourth embodiment, two rolls pre-wound with both copper and aluminum sheets may be arranged as indicated in FIG. 5, whereby an upper pre-wound roll 20 of copper and aluminum sheeting, which is advantageously foil, is positioned above a prepreg 16. A lower pre-wound roll 22 of copper and aluminum sheeting is positioned below the prepreg 16. The prepreg 16 is dispensed between the sheets that are unwound from the upper pre-wound roll 20 and from the lower pre-wound roll 22 so as to generate a prepreg 16 having an upper aluminum sheeting layer 24a and an upper copper sheet layer 26a disposed above prepreg 16, and a lower copper sheet layer 26b and a lower aluminum sheeting layer 24b disposed below prepreg 16 such that upper copper sheet layer 26a and lower copper sheet layer 26b contact prepreg 16. The unbonded layers are cut and stacked on carrier 14 to form a book.

Figure 6:
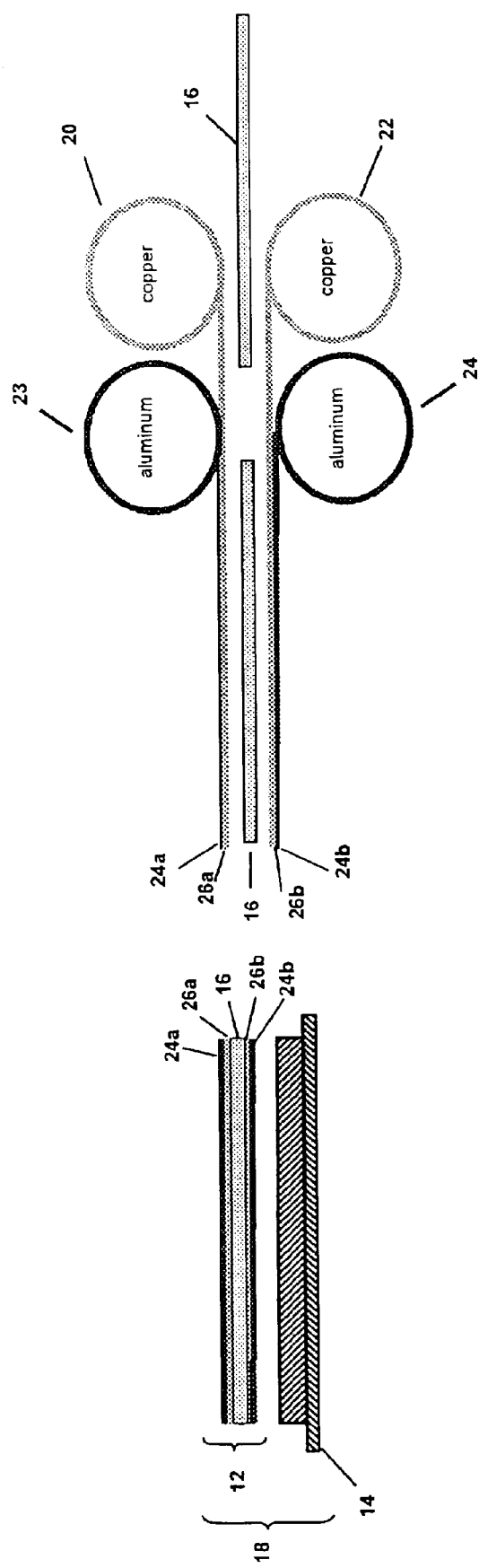
FIG. 6 is diagram illustrating an apparatus similar to the apparatus of FIG. 5, except that the copper and aluminum are provided by separate rolls.

In a modification of the fifth embodiment, two rolls of copper foil and two rolls of aluminum sheeting may be arranged as indicated in FIG. 6, whereby an upper roll of copper foil 20 is dispensed concurrently with an upper aluminum sheeting roll 23 and positioned above the prepreg 16. A lower roll of copper foil 22 and a lower roll of aluminum sheeting 24 simultaneously dispense layers of copper and aluminum sheeting below the prepreg 16. The prepreg 16 is dispensed between the sheets that are unwound from the upper copper roll 20 and upper aluminum roll 23 and from the lower copper roll 22 and the lower aluminum roll 24 so as to generate a prepreg 16 having an upper aluminum sheeting layer 24a and an upper copper layer 26a disposed above prepreg 16, and a lower copper layer 26b and a lower aluminum sheeting layer 24b disposed below prepreg 16 such that upper copper layer 26a and lower copper layer 26b contact prepreg 16. The unbonded layers are cut and stacked on carrier 14 to form a book.

The planar dimensions of the prepreg and initially cut aluminum and copper sheets can be about three feet by about four feet. The book is sandwiched between a pair of carrier plates, typically formed of stainless steel. A layer of padding typically is also provided between each carrier plate and the book. The padding is formed of a thermally insulating material such as insulating kraft paper; alternatively, chip board can be used.

A plurality of books of prepreg 16, copper 26a, 26b, and protective-carrier separator sheets 24a, 24b can then be stacked and pressed in a curing press. After pressing, the books (with separator sheets still in place) are transferred to a cutting apparatus. Prior to cutting, an upper and lower rigid backing material or board, such as phenolic or non-phenolic backer is positioned on the top and bottom of the stack. These backers improve the quality of the cutting. The cutting apparatus is advantageously a paneling saw, although the invention is not limited in this respect, and a router or other cutting tool may be used.

With the separator sheets remaining in place between the copper sheets, the book is cut on the cutting apparatus to final customer dimensions. Following cutting and sizing, the stacks of cut panels, with the aluminum separator sheets still in place, are inspected, and the separator sheets are then separated from the copper-clad laminate.

Advantageously, the aluminum sheet 8 in FIG. 1 and upper and lower aluminum sheeting layers 24a, 24b in FIG. 5 have a thickness in the range of about 0.08 to about 0.50 mm (about 0.003 to about 0.020 inches); in some embodiments, the thickness of the aluminum sheeting is in the range from about 0.1 to about 0.25 mm (about 0.004 to about 0.010 inches). The aluminum sheeting should be thick enough to facilitate its handling in accordance with the processes of this invention yet thin enough to maintain low material costs in a disposable process and to enable stacking of many unbonded laminates (e.g., 60 to 100) in a book of a given height. However, the aluminum sheet may be of any desired thickness depending upon the layup being prepared.

The copper sheets 6 and 10 in FIGS. 1–4 and 26a and 26b in FIG. 5 are advantageously 0.013 mm to 0.064 mm (0.0005 to 0.0025 inches); typically, this range is expressed as 0.5 to 2 ounces per square foot. More broadly, the range of thickness for the copper sheets can be 0.005 mm to 0.30 mm (0.0002 to 0.012 inches or 0.25 to 10 ounces per square foot).

The copper foil rolls 2a, 2b and aluminum sheeting 4 (illustrated in FIG. 1) and the aluminum/copper rolls 20, 22 (illustrated in FIG. 5) may be obtained from numerous suppliers in the marketplace. Copper foils, such as 1 oz DSTF™, HTE may be obtained from Gould Electronics, Eastlake, Ohio, U.S.A.; Circuit Foils USA, Bordentown, N.J., U.S.A.; Cookson-Fukuda Ltd., United Kingdom; and Oak Mitsui, Hoosick Falls, N.Y., U.S.A. Aluminum foils, such as #1100 RRU, 3-MIL; #1100 RRU, 2-MIL, and #3033, may be obtained from Ormet Corporate Headquarters, Wheeling, W. Va., U.S.A.; and Ormet Foils Division, Jackson, Tenn., U.S.A. Other aluminum foils, such as #1145-0, 0.001-inch and #1145-0, 0.0015-inch, may be obtained from All Foils, Cleveland, Ohio, U.S.A. 0.00445-inch and 0.007-inch aluminum foil may be obtained from Alcoa Foil Products, Lebanon, Pa., U.S.A. As an alternative to aluminum sheeting, thin sheets of steel or rigid plastics capable of withstanding temperatures of about 300–400° F. (~150–200° C.) during lamination can be used.

The process described herein is not limited to the copper-aluminum-copper composite layup 18, and may also employ other metal foils and/or polymeric films in the assembly of a variety of different layups used in the printed circuit board and electronic industry.

Description of Experimental Results

Several experimental trials were conducted in which a roll of copper foil was cosheeted with a roll of aluminum sheeting and cut to form many cosheeted copper/aluminum layers in a tray. The exposed copper surface in each pair of cosheeted copper/aluminum was then laminated to a layer of prepreg in a lamination press, as described above. Additionally, similar trials were conducted using precut sheets of aluminum and combining those with precut sheets of copper foil, which were subsequently laminated as described above. The data produced with each of these procedures was substantially consistent in terms of defect rates, and the rates listed for the "new process" in the table, below, represent combined rates for the two sets of trials described above.

In the trials, the thickness of the aluminum sheeting ranged from 0.076 mm to 0.254 mm (0.003 inches to 0.010 inches). Quality data was gathered from the laminates produced by these trials and compared to with quality data from laminates produced via the conventional process. As a point of reference, the conventional process involved the build up of a laminate book utilizing stainless steel plates in the place of aluminum sheets. The conventional process employs stainless steel plates typically in the range of 1.2 mm to 2.3 mm (0.050 inches to 0.090 inches). The stainless steel plates are reused after each press lamination cycle and cleaned typically by a machine that consists of one or more rotating brushes for each side of the plate followed by a washer and dryer. The brushes vary in composition and are typically designed to remove any debris that may deposit and become adhered to the plate.

In comparison to conventional techniques, quality of the laminate surface (i.e., the exposed copper surface after the post-lamination removal of the cosheeted aluminum) was substantially improved. Surface quality generally met or exceeded surface requirements as inspected per IPC-4101, Base Materials Specification, Class B surface, with reductions in the typical defects related to surface contamination. These included pits, pits with deposits, dents, stains, epoxy spots and other imperfections known in the conventional art. The Experimental results are presented in Table I.

TABLE I

Summary of Surface Inspection Results

| Surface Defect | Conventional Process | New Process | Improvement |
| --- | --- | --- | --- |
| Pits | 1.11% | 0.28% | 75% |
| Pits with deposits | 0.51% | 0.12% | 76% |
| Dents | 0.54% | 0.01% | 98% |
| Stains | 0.49% | 0.28% | 43% |
| Epoxy Spots | 0.40% | 0.08% | 80% |
| Cumulative Total Defective | 3.05% | 0.77% | 75% |

Equivalents

Although particular embodiments have been disclosed herein in detail, this has been done by way of example for purposes of illustration only and is not intended to be limiting. In particular, it is contemplated by the inventors that various substitutions, alterations, and modifications may be made to the invention without departing from the scope of the invention. It is intended, therefore, that the invention be limited only as indicated by the scope of the claims appended hereto.

What is claimed is:

1. A method for producing laminates for printed wiring boards using protective-carrier sheeting, the method comprising the steps of:
   (a) sandwiching a layer of protective-carrier sheeting between two layers of conductive foil extended from one or more conductive-foil sources, wherein a layer of the conductive foil and the protective-carrier sheeting are unwound from a common roll, and wherein the conductive foil comprises copper, and the protective-carrier sheeting comprises aluminum and has a thickness in the range from about 0.08 mm to about 0.5 mm;
   (b) covering one of the conductive-foil layers with a dielectric layer to sandwich the covered conductive-foil layer between the dielectric layer and the layer of protective-carrier sheeting; and
   (c) repeating steps (a) and (b) and stacking the layers to form a book without the conductive-foil layers being bonded to the protective-carrier sheeting or to the dielectric layer.

2. The method of claim 1, wherein the layer of protective-carrier sheeting has a thickness in the range from 0.1 mm to 0.25 mm.

3. The method of claim 1, wherein the conductive-foil sources are rolls of copper foil.

4. The method of claim 3, wherein the dielectric layer comprises prepreg.

5. The method as recited in claim 3, further comprising the steps of:
   (d) placing the book in a lamination press; and
   (e) pressing the book without inclusion of an adhesive or mechanical attachment between the protective-carrier sheeting and conductive foil.

6. A method for producing laminates for printed wiring boards using protective-carrier sheeting, the method comprising the steps of:
   (a) sandwiching a dielectric layer between two layers of conductive foil extended from conductive-foil sources, wherein at least one of the layers of conductive foil is covered by a layer of protective carrier sheeting, and wherein the covered layer of conductive foil and the covering layer of protective-carrier sheeting are unwound and extended from a common roll, and wherein the conductive foil comprises copper, and the protective-carrier sheeting comprises aluminum and has a thickness in the range from about 0.08 mm to about 0.5 mm; and
   (b) repeating step (a) and stacking the layers to form a book, wherein each layer of conductive foil is sandwiched between a dielectric layer and a layer of protective-carrier sheeting without the conductive-foil layers being bonded to the protective-carrier sheeting or to the dielectric layer.

7. The method of claim 6, wherein the layer of protective-carrier sheeting has a thickness in the range from 0.1 mm to 0.25 mm.

8. The method of claim 6, wherein the conductive-foil sources comprise rolls of copper foil.

9. The method of claim 6, wherein the dielectric layer comprises prepreg.

10. The method as recited in claim 6, further comprising the steps of:
    (d) placing the book in a lamination press; and
    (e) pressing the book without inclusion of an adhesive or mechanical attachment between the protective-carrier sheeting and conductive foil.

* * * * *